(12) United States Patent
Yoon et al.

(10) Patent No.: US 8,788,908 B2
(45) Date of Patent: Jul. 22, 2014

(54) DATA STORAGE SYSTEM HAVING MULTI-BIT MEMORY DEVICE AND ON-CHIP BUFFER PROGRAM METHOD THEREOF

(75) Inventors: Sangyong Yoon, Seoul (KR); Kitae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 206 days.

(21) Appl. No.: 13/225,676

(22) Filed: Sep. 6, 2011

(65) Prior Publication Data

US 2012/0290897 A1 Nov. 15, 2012

(30) Foreign Application Priority Data

May 11, 2011 (KR) .................. 10-2011-0044134

(51) Int. Cl.
*G11C 29/00* (2006.01)

(52) U.S. Cl.
USPC ............................................................ 714/766

(58) Field of Classification Search
USPC ............................................................ 714/766
See application file for complete search history.

(56) References Cited

U.S. PATENT DOCUMENTS

| | | | | |
|---|---|---|---|---|
| 5,392,416 A | * | 2/1995 | Doi et al. | 711/3 |
| 6,832,291 B2 | * | 12/2004 | Lee | 711/114 |
| 7,162,645 B2 | * | 1/2007 | Iguchi et al. | 713/193 |
| 7,409,623 B2 | * | 8/2008 | Baker et al. | 714/763 |
| 7,813,187 B2 | | 10/2010 | Lee | |
| 8,443,260 B2 | | 5/2013 | Shlick et al. | |
| 2007/0115719 A1 | * | 5/2007 | Wu | 365/185.03 |
| 2007/0285980 A1 | | 12/2007 | Shimizu et al. | |
| 2008/0301532 A1 | | 12/2008 | Uchikawa et al. | |
| 2012/0297115 A1 | * | 11/2012 | Liang | 711/103 |

FOREIGN PATENT DOCUMENTS

| | | |
|---|---|---|
| JP | 2007-350210 | 11/2007 |
| JP | 2008-077810 | 4/2008 |
| KR | 10-0894927 | 4/2009 |
| KR | 10-0926475 | 11/2009 |

* cited by examiner

*Primary Examiner* — Guy Lamarre
(74) *Attorney, Agent, or Firm* — Volentine & Whitt, PLLC

(57) ABSTRACT

A data storage device includes a multi-bit memory device including a memory cell array, the memory cell array including a first memory region and a second memory region, and a memory controller including a buffer memory and configured to control the multi-bit memory device. The memory controller is configured to control the multi-bit memory device to execute a buffer program operation in which data stored in the buffer memory is stored in the first memory region, and to control the multi-bit memory device to execute a main program operation in which the data stored in the first memory region is stored in the second memory region. The memory controller is further configured to generate parity data based upon the data stored to the first region, the parity data being copied from the first memory region to the second memory region via the main program operation.

12 Claims, 11 Drawing Sheets

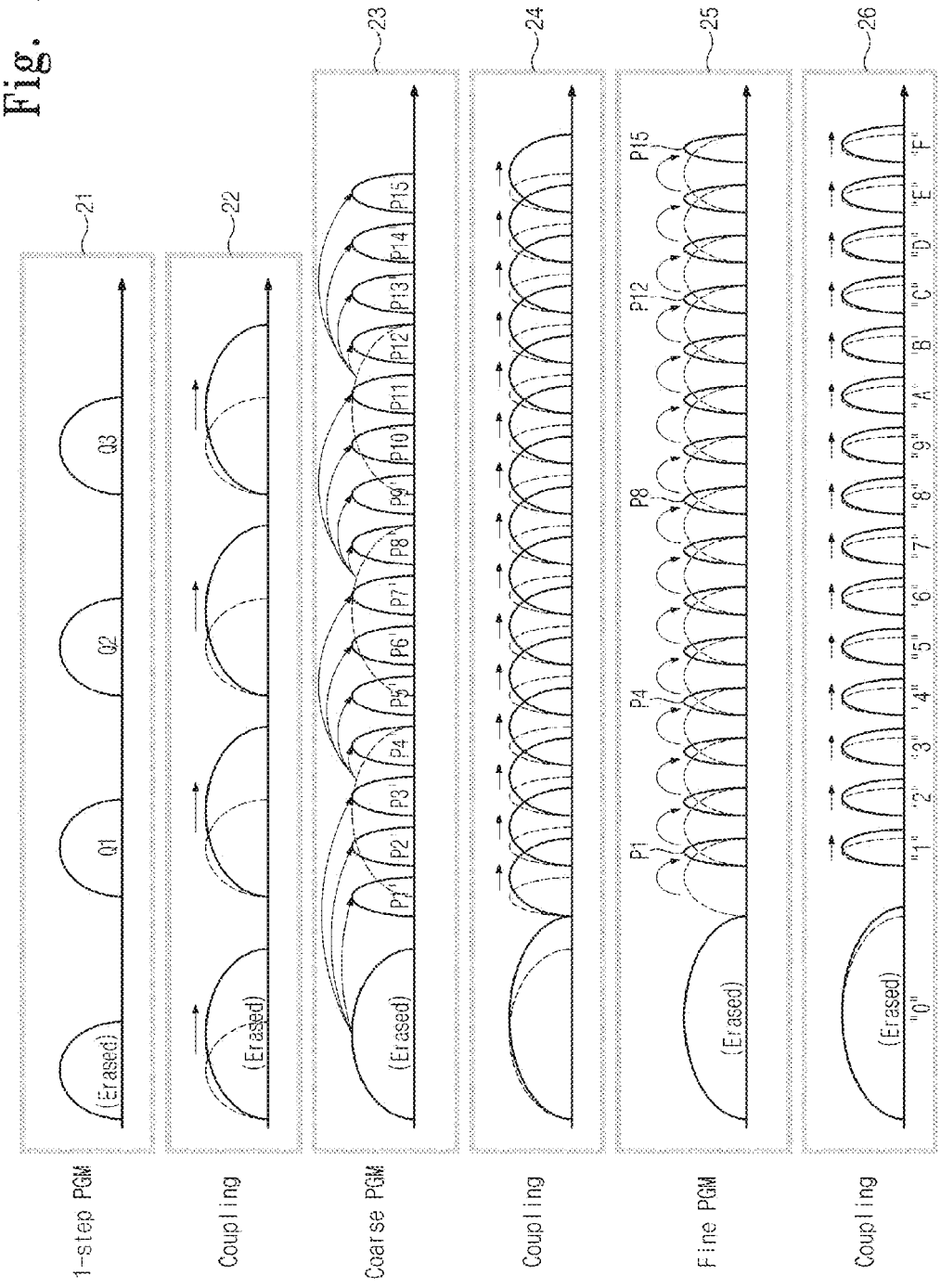

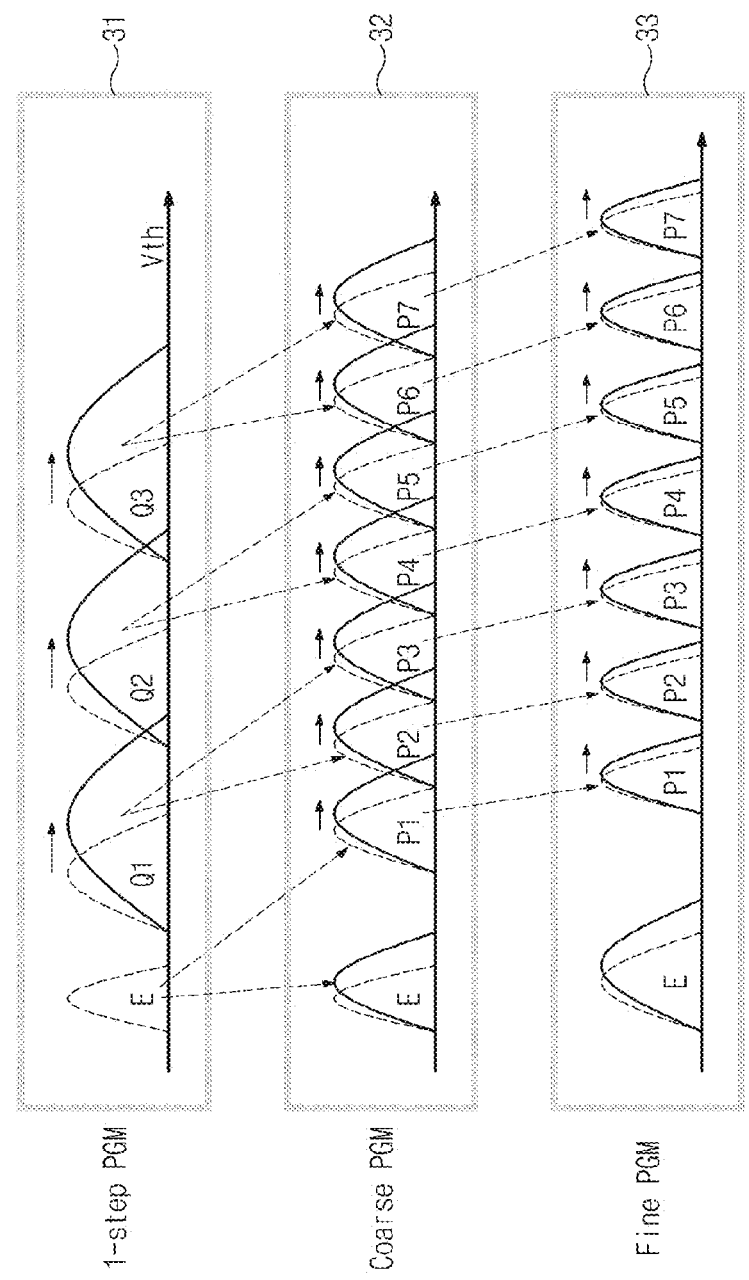

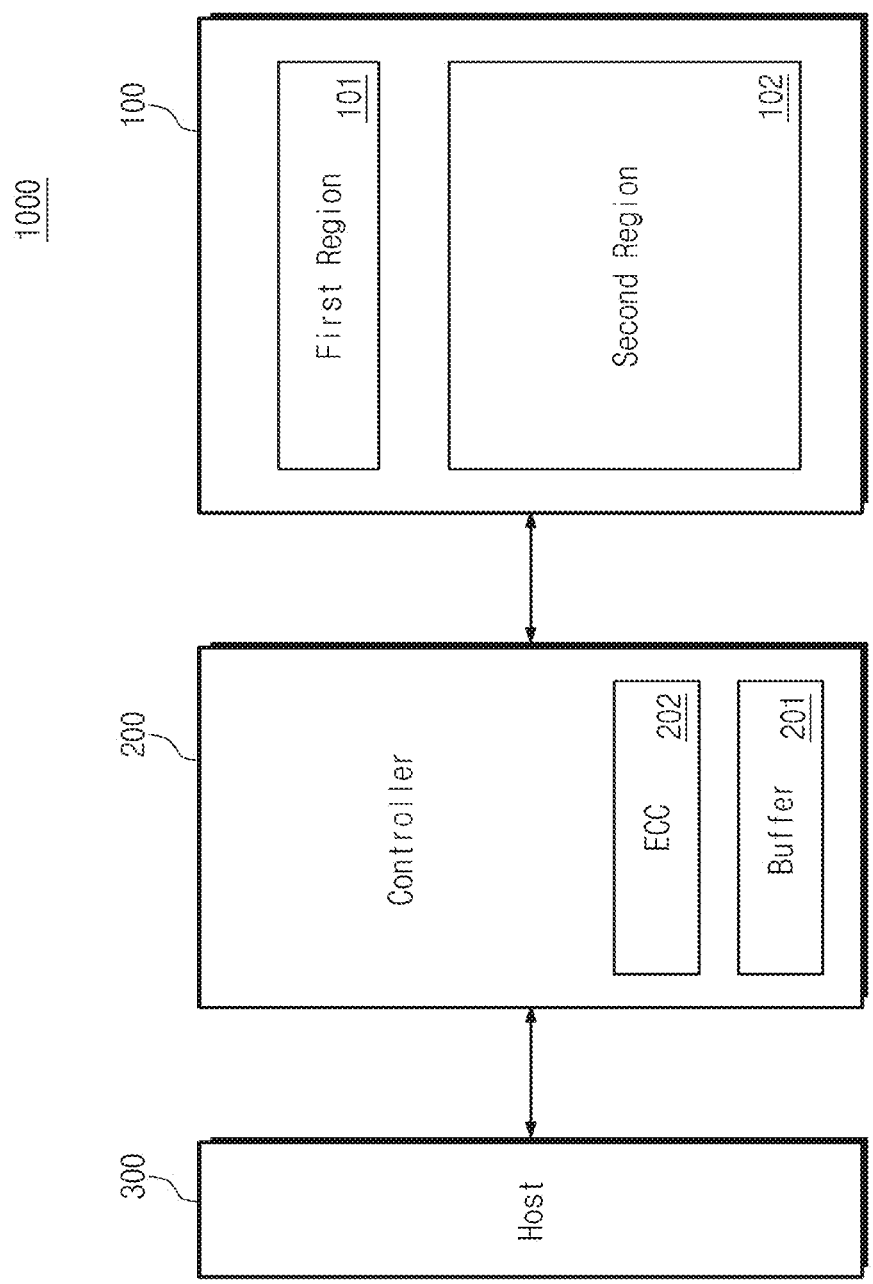

Fig. 3

| WL | 1st | CRS | FIN |
|---|---|---|---|
| 63 | 186,189 | 191 | |
| 62 | 183,187 | 190 | |
| 61 | 180,184 | 188 | |
| ⋮ | ⋮ | ⋮ | ⋮ |
| 3 | 6,10 | 14 | |
| 2 | 3,7 | 11 | |
| 1 | 1,4 | 8 | |
| 0 | 0,2 | 5 | |

- 1st: 1st Step (4-Level)
- CRS: Coarse PGM (8-Level)
- FIN: Fine PGM (8-Level)

DATA STORAGE SYSTEM HAVING MULTI-BIT MEMORY DEVICE AND ON-CHIP BUFFER PROGRAM METHOD THEREOF

CROSS-REFERENCE TO RELATED APPLICATIONS

A claim of priority under 35 U.S.C §119 is made to Korean Patent Application No. 10-2011-0044134, filed May 11, 2011, the entirety of which is incorporated by reference herein.

BACKGROUND

Exemplary embodiments relate to electronic devices, and more particularly, to memory systems and to methods of operating memory systems.

Semiconductor memory devices constitute a vital microelectronic component commonly found in digital logic systems, such as computers, and in microprocessor-based appliances ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices are generally classified as volatile memory devices, such as random access memory (RAM) devices, or nonvolatile memory devices. In RAM devices, data is stored by either establishing the logic state of a bistable flip-flop such as in a static random access memory (SRAM), or by charging a capacitor in a dynamic random access memory (DRAM). In volatile memory devices, such as SRAM and DRAM devices, data remains stored and may be read as long as power is applied, but data is lost when the applied power is turned off or otherwise interrupted.

Mask read-only memory (MROM), programmable read-only memory (PROM), erasable programmable read-only memory (EPROM) nonvolatile memory, and electrically erasable programmable read-only memory (EEPROM) devices are examples of non-volatile memory devices which retain stored data even in the absence of applied power. Further, the non-volatile memory data storage state may be permanent or reprogrammable, depending upon the fabrication technology used. Non-volatile semiconductor memories are used as program and microcode storage in a wide variety of applications in the computer, avionics, telecommunications, and consumer electronics industries. A single-chip combination of volatile as well as non-volatile memory storage modes is also available in devices, such as non-volatile SRAM (nvRAM), for use in systems that require fast, reprogrammable non-volatile memory. In addition, dozens of special memory architectures have evolved which contain some additional logic circuitry to optimize their performance for application-specific tasks.

Mask read-only memory (MROM), programmable read-only memory (PROM) and erasable programmable read-only memory (EPROM) nonvolatile memory devices are not freely capable of self-erase and write functionality, and it is thus not easy to update the contents of these memories. On the other hand, electrically erasable programmable read-only memory (EEPROM) nonvolatile memory devices are electrically erasable and writable, and may thus be readily applied to auxiliary memories or system programming memories that require continuous updating.

SUMMARY

According to an aspect of embodiments of the inventive concepts a data storage device is provided which includes a multi-bit memory device including a memory cell array, the memory cell array including a first memory region and a second memory region, and a memory controller including a buffer memory and configured to control the multi-bit memory device. The memory controller is configured to control the multi-bit memory device to execute a buffer program operation in which data stored in the buffer memory is stored in the first memory region, and to control the multi-bit memory device to execute a main program operation in which the data stored in the first memory region is stored in the second memory region. The memory controller is further configured to generate parity data based upon the data stored to the first region, the parity data being copied from the first memory region to the second memory region via the main program operation.

According to another aspect of embodiments of the inventive concepts, a data storage device is provided which includes a multi-bit memory device and a memory controller. The multi-bit memory device includes a first memory region and a second memory region, the second memory region including a memory block defined by a plurality of word lines, and each of the word lines of the second memory region for storing M pages of data, where M is a plural integer. The memory controller includes a memory buffer and an error correction code (ECC) circuit which generates ECC data, and is configured to execute a buffer program operation and a main program operation to program the word lines of the memory block of the second memory region. The buffer program operation includes sequentially transferring pages of data and corresponding ECC data from the buffer memory to the first memory region. The main program operation includes multi-bit programming a selected word line of the memory block of the second memory region to store selected pages of data and corresponding ECC data read from the first memory region.

According to still another aspect of the inventive concepts, an on-chip buffer program method of a data storage device is provided. The data storage device includes a multi-bit memory device having a memory cell array, and a memory controller having a buffer memory and configured to control the multi-bit memory device. The on-chip buffer program method includes executing a buffer program operation when data corresponding to a minimum program unit of a first region of the memory cell array is stored in the buffer memory, and executing a main program operation when data corresponding to a minimum program unit of a second region of the memory cell array is stored in the first region. The buffer program operation includes generating parity data based upon data transferred to the first region, and the main program operation includes copying the parity data from the first region to the second region.

BRIEF DESCRIPTION OF THE DRAWINGS

The above and other objects and features will become apparent from the detailed description that follows with reference to the accompanying drawings, in which like reference numerals refer to like parts throughout the various figures unless otherwise specified, and in which:

FIG. 1B is a diagram showing variations in threshold voltage distributions when a 3-step programming operation is executed to store 4-bit data in each memory cell;

FIG. 1C is a diagram showing variations in threshold voltage distributions when a 3-step programming operation is executed to store 3-bit data in each memory cell;

FIG. 2 is a block diagram showing a data storage system according to an exemplary embodiment of the inventive concepts;

FIG. 3 is a diagram showing an exemplary address scramble technique of a multi-bit memory device which stores 3-bit data per cell and to which a 3-step reprogram method is applied;

DETAILED DESCRIPTION

Figure 1A:
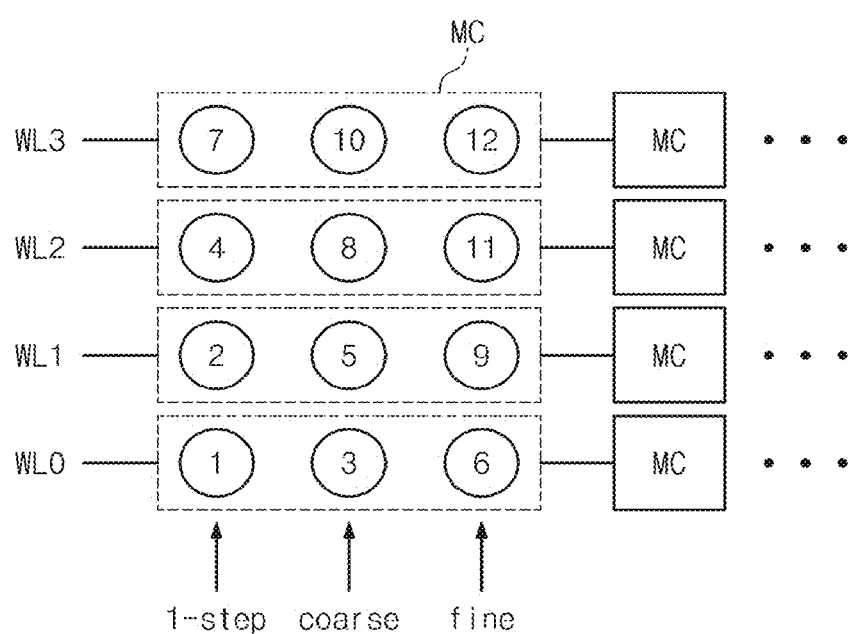
FIG. 1A a diagram showing an example of an address scramble technique applied to a multi-level memory device according to an exemplary embodiment of the inventive concepts.

The inventive concepts are described more fully hereinafter with reference to the accompanying drawings, in which embodiments of the inventive concept are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

With an increase in the number of data bits stored in each memory cell, it is increasingly difficult to secure reliability of a memory device storing multi-bit (or, multi-level) data, which is referred to herein as a multi-level memory device. One potential factor causing degradation in reliability may be unintended threshold voltage variations resulting from coupling between adjacent memory cells. For example, a threshold voltage of a previously programmed memory cell may be varied due to coupling when a memory cell adjacent to a programmed memory cell is programmed. In an effort to manage such coupling effects, an address scramble technique has been developed, an example of which is represented in FIG. 1A.

An address scramble technique will now be described with reference to FIG. 1A assuming, by way of example, that 3-bit data is stored in each memory cell. Further, for simplicity, FIG. 1A illustrates only four word lines WL0 to WL3, each connected to a plurality of memory cells MC.

Initially, in this example, a 1-step program operation is performed in which lower 2-bit data (i.e., the lower two bits of the 3-bit data) is stored to each memory cell MC of the first word line WL0. That is, during the 1-step program operation, two pages of data are stored in the memory cells MC connected of the first word line WL0. This is represented by ①̂ in FIG. 1A. Next, in the example of FIG. 1A, the 1-step program operation is performed with respect to the memory cells MC of the second word line WL1. This is represented by ②̂ in FIG. 1A. After the 1-step program operation is performed with respect to the memory cells MC of second word line WL1, a coarse program operation is performed with respect to the memory cells MC of the first word line WL0. Here, the first word line WL0 which is located below the second word line WL1 and has previously been programmed with lower 2-bit data. This coarse programming of the first word line WL0 is represented by ③ in FIG. 1A. During the coarse program operation of this example, upper 1-bit data (i.e., the most significant bit of the three-bit data) is stored in memory cells MC of the first word line WL0. Following the coarse program operation of memory cells MC of the first word line WL0, the 1-step program operation is executed with respect to the third word line WL2. This is represented by ④ in FIG. 1A. After the 1-step program operation on the third word line WL2, the coarse program operation is performed to store upper 1-bit data in memory cells connected with the second word line WL1. This is represented by ⑤ in FIG. 1A. Following the coarse program operation on the second word line WL1, a fine program operation is executed with respect to the first word line WL0. This is represented by ⑥ in FIG. 1A. Thereafter, in this example, the 1-step, coarse, and fine program operations are sequentially executed in the order represented by the remaining circled number of FIG. 1A. The manner of selecting word lines according to a given programming order such as that shown in FIG. 1A is referred to herein as an address scramble technique.

Once the 1-step program operation and the coarse program operation are completed, all threshold voltage distributions (for example, $2^M$ threshold voltage distributions) corresponding to M-bit data (M being 2 or more integer) have been formed in the respective memory cells. However, margins between threshold voltage distributions may be insufficient to adequately distinguish between the threshold voltage distributions in a read operation. As such, the fine program operation is carried out to secure sufficient read margins. The fine program operation may be performed to narrow a width of each threshold voltage distribution. For example, during the fine program operation, verification voltages may be used which are increased relative to verification voltages used during the coarse program operation. Fine programming makes it possible to reduce coupling between adjacent memory cells, and may be referred to as a reprogram method (or reprogram algorithm).

The above-described example, a scramble technique and reprogram method is applied to program 3-bit data. However, these processes may generally be applied to the programming M-bit data, where M is an integer of 2 or more, such as 2-bit data and 4-bit data.

With the reprogram method, it is necessary to retain data of memory cells of a given word line in a separate storage until the fine program operation is executed for the given word line. For example, the 1-step program operation may be carried out based on data provided to from a memory controller, and the coarse program operation may be carried out based on data stored in the 1-step program operation and data provided from the memory controller. The fine program operation may also be carried out based on stored through the 1-step and coarse program operations. However, as described above, insufficient read margins can make it difficult to precisely read data stored after the 1-step and coarse program operations. As a result data necessary for the fine program operation must be provided to the multi-bit memory device from the memory controller, and therefore the memory controller must retain the data until the fine program operation for the given word line is executed. This means that the memory controller must be equipped with a relatively large buffer memory.

FIG. 1B is a diagram showing variations in threshold voltage distributions when a program operation is carried out according to 3-step programming to store 4-bit data in each memory cell.

Referring to the example of FIG. 1B, 2-page data (i.e., the first and second pages of data) are stored in memory cells of a selected word line (e.g., WL0 in FIG. 1A). At this time, as illustrated in a box 21 of FIG. 1B, memory cells in a threshold voltage distribution corresponding to an erase state E may be programmed to have threshold voltages in threshold voltage distributions corresponding to program states Q1, Q2, or Q3, based on data to be programmed.

As described above, before a coarse program operation of previously 1-step programmed memory cells in a given word line (for example, WL0), a 1-step program operation of memory cells in an adjacent word line (e.g., WL1) may be executed. As a result, as illustrated in a box 22 of FIG. 1B, distributions of 1-step programmed memory cells in the given word line (e.g., WL0) may widen due to coupling caused when memory cells in the adjacent word line (e.g., WL1) are programmed.

Next, according to this example, 2-page data, that is, the third and fourth pages of data are stored in memory cells of the selected word line WL0. At this time, as illustrated in a box 23 of FIG. 1B, memory cells in the threshold voltage distribution of states E, Q1, Q2 and Q3 may be programmed to have threshold voltages in corresponding threshold voltage distributions of states E~P15'. For example, memory cells in a threshold voltage distribution corresponding to an erase state E may be programmed to have threshold voltages in corresponding threshold voltage distributions to program states P1' to P3', based on data to be programmed. Memory cells in a threshold voltage distribution corresponding to a program state Q1 may be programmed to have threshold voltages in corresponding threshold voltage distributions to program states P4' to P7', based on data to be programmed. Memory cells in a threshold voltage distribution corresponding to a program state Q2 may be programmed to have threshold voltages in corresponding threshold voltage distributions to program states P8' to P11', based on data to be programmed. Memory cells in a threshold voltage distribution corresponding to a program state Q3 may be programmed to have threshold voltages in corresponding threshold voltage distributions to program states P12' to P15', based on data to be programmed.

As described above, before a fine program operation of coarse programmed memory cells in a given word line (e.g., WL0), a 1-step program operation and a coarse program operation may be executed on adjacent word lines (e.g., WL2 and WL1). At result, as illustrated by a box 24 of FIG. 1B, distributions of coarse programmed memory cells in the given word line (e.g., WL0) may widen due to the coupling caused when memory cells in adjacent word lines (e.g., WL2 and WL1) are programmed. As explain previously, this can make it difficult to accurately read data from coarse programmed memory cells.

Memory cells in the word line WL0 may be programmed to have final threshold voltage distributions P1 to P15 as illustrated in a box 25 of FIG. 1B. This operation is referred to herein as a fine program operation. As described above, the fine program operation may require access to previously programmed data (e.g., the first to fourth pages of data). Since it is difficult to read previously programmed data from memory cells in the word line WL0, the fine program operation may be executed based on data provided from a memory controller (or, data maintained by a memory device). As illustrated in a box 26 of FIG. 1B, distributions of fine programmed memory cells may widen due to the coupling caused when memory cells in adjacent word lines are programmed.

A 1-step program operation, a coarse program operation, and a fine program operation on each word line may be executed according to a program order (or, sequence) shown in FIG. 1A, in which each word line is programmed as described in FIG. 1B.

FIG. 1C is a diagram showing variations in voltage distributions when a program operation is carried out according to 3-step programming to store 3-bit data in each memory cell.

Referring to the example of FIG. 1C, 2-page data (i.e., the first and second pages of data) are stored in memory cells of a selected word line (e.g., WL0 in FIG. 1A). At this time, as illustrated in a box 31 of FIG. 1C, memory cells in a threshold voltage distribution corresponding to an erase state E may be programmed to have threshold voltages in threshold voltage distributions each corresponding to program states Q1, Q2, or Q3, based on data to be programmed.

As described above, before a coarse program operation of 1-step programmed memory cells in a given word line (e.g., WL0) is executed, a 1-step program operation of memory cells in an adjacent word line (e.g., WL1) may be executed. At this time, as illustrated by a solid line of a box 31 of FIG. 1C, distributions of 1-step programmed memory cells in the given word line (e.g., WL0) may widen due to the coupling caused when memory cells in an adjacent word line (e.g., WL1) are programmed.

Then, in this example, 1-page data is stored in memory cells of the selected word line WL0. At this time, as illustrated in a box 32 of FIG. 1C, memory cells in a threshold voltage distribution corresponding to states E, Q1, Q2 and Q3 may be programmed to have threshold voltages in corresponding threshold voltage distributions. For example, memory cells in a threshold voltage distribution corresponding to an erase state E may be programmed to have threshold voltages in a corresponding threshold voltage distribution to a program state P1, based on data to be programmed. Memory cells in a threshold voltage distribution corresponding to a program state Q1 may be programmed to have threshold voltages in corresponding threshold voltage distributions to program states P2 and P3, based on data to be programmed. Memory cells in a threshold voltage distribution corresponding to a program state Q2 may be programmed to have threshold voltages in corresponding threshold voltage distributions to program states P4 and P5, based on data to be programmed. Memory cells in a threshold voltage distribution corresponding to a program state Q3 may be programmed to have threshold voltages in corresponding threshold voltage distributions to program states P6 to P7, based on data to be programmed.

As described above, a fine program operation of coarse programmed memory cells in a word line (e.g., WL0) may be carried out after a 1-step program operation and a coarse program operation on adjacent word lines (e.g., WL2 and WL1). At this time, as illustrated by a solid line in a box 32 of FIG. 1C, distributions of coarse programmed memory cells in the word line (for example, WL0) may widen due to coupling caused when memory cells in adjacent word lines (for example, WL2 and WL1) are programmed. As explained previously, this makes it difficult to accurately read data from coarse programmed memory cells.

Memory cells in the word line WL0 may be programmed to have final threshold voltage distributions P1 to P7 as illustrated in a box 33 of FIG. 1C. This operation is referred to herein as a fine program operation. As described above, the fine program operation may require access to previously programmed data (e.g., the first to third pages of data). Since it is difficult to read previously programmed data from memory cells in the word line WL0, the fine program operation may be made based on data provided from a memory controller (or, data maintained by a memory device). As illustrated by a solid line in a box 33 of FIG. 1C, distributions of fine programmed memory cells may widen due to coupling caused when memory cells in adjacent word lines are programmed.

A 1-step program operation, a coarse program operation, and a fine program operation on each word line may be executed according to a program order (or, sequence) shown in FIG. 1A, in which each word line is programmed as described in FIG. 1C.

FIG. 2 is a block diagram showing a data storage system according to an exemplary embodiment of the inventive concepts.

Referring to FIG. 2, a data storage system 1000 may include a multi-bit memory device 100 as a nonvolatile memory device, a memory controller 200, and a host 300. The multi-bit memory device 100 may be formed of one or more memory chips. As a data storage device, the multi-bit memory device 100 and the memory controller 200 may constitute a memory card, a Solid State Drive (SSD), a memory stick, or the like. The multi-bit memory device 100 may include a plurality of memory blocks (or, sectors/banks), each of which has memory cells arranged in rows and columns. Each of the memory cells may store multi-bit (or, multi-level) data. The memory cells may be arranged in a 2-dimensional array structure and/or a 3-dimensional/vertical array structure. Exemplary 3-dimensional array structures are disclosed in U.S. Patent Publication Nos. 2008/0023747 and 2008/0084729, the entireties of which are incorporated by reference herein.

In the example of this embodiment, memory blocks of the multi-bit memory device 100 are divided into at least two regions, that is, a first region 101 and a second region 102. Herein, it is understood that the first and second regions 101 and 102 may logical defined and/or physically defined. For example, in the case of logical definition of first and second regions 101 and 102, the regions 101 and 102 can be readily changed. As another example, the multi-bit memory device 100 may be formed of a plurality of chips, and the two regions 101 and 102 can be divided physically by being defined on separate chips.

Also, memory blocks in the first region 101 may be programmed in a manner different from memory blocks in the second region 102. For example, memory blocks in the first region 101 may be programmed according to a single-bit program (hereinafter, referred to as an SLC program), and memory blocks in the second region 102 may be programmed according to a multi-bit program (e.g., the above-described N-step reprogram) (hereinafter, referred to as an MLC program). In such an example, each memory cell in the first region 101 may store 1-bit data, while each memory cell in the second region 102 may store M-bit data (M being an integer of 3 or more). Further, each memory cell in the first region 101 may store less data bits in number as compared with M-bit data (M being an integer of 3 or more) stored in each memory cell in the second region 102.

Continuing to refer to FIG. 2, the memory controller 200 may be configured to control the multi-bit memory device 100 in response to a request of the host 300. The memory controller 200 may include a buffer memory 201 and an ECC block 202. The buffer memory 201 may be used to temporarily store data sent from the host 300 and data read out from the multi-bit memory device 100. The memory controller 200 may control a program operation of the multi-bit memory device 100 in a static scheduling manner. For example, when data of the minimum program unit of the first region 101 is stored in the buffer memory 201, the memory controller 200 may control the multi-bit memory device 100 such that data of the minimum program unit is stored (or, programmed) in the first region 101. This is referred to herein a buffer program operation (BP).

When data of the minimum program unit of the second region 102 is gathered at the first region 101, the memory controller 200 may control the multi-bit memory device 100 such that data of the minimum program unit of the second region 102 is stored (or, programmed) in the second region 102. This is referred to herein a main program operation (MP). The buffer program operation and the main program operation may form an on-chip buffer program (OBP) operation, which will be more fully described later.

The ECC block 202 may be configured to generate ECC data (also called parity data) based upon data (e.g., program data) transferred to the multi-bit memory device 100 from the buffer memory 201. A size of the ECC data may be determined considering a size of program data, a program protocol (e.g., SLC and MLC programming), a cell-per-bit number, and the like. For example, the error correction capacity applied to a memory device storing multi-bit data in each memory cell may be larger than that applied to a memory device storing 1-bit data in each memory cell. A large error correction capacity may indicate that a size of ECC data used to detect and correct an error is large. The ECC block 202 may be configured to generate ECC data having a size suitable for a program protocol (i.e., a multi-bit programming) of the second region 102, based upon program data transferred to the memory device 100. In this case, a size of ECC data corresponding to program data stored in the first region 101 may be determined regardless of a program protocol (i.e., a single-bit programming) of the first region 101. Alternatively, the ECC block 202 may be configured to generate ECC data suitable for a program protocol of the first region 101 and to generate ECC data having a size suitable for a program protocol of the second region 102. In this case, a size of ECC data corresponding to program data to be stored in the first region 101 may be determined according to the program protocol of the first region 101, and a size of ECC data corresponding to program data to be stored in the second region 102 may be determined according to the program protocol of the second region 102. This will be more fully described below.

In an exemplary embodiment, the minimum program unit of the first region 101 and the minimum program unit of the second region 102 may be variously determined depending upon a program protocol, a cell-per-bit number, and the like. The minimum program unit of the first region 101 may be different from the minimum program unit of the second region 102.

In an exemplary embodiment, it is possible to reduce a size of the buffer memory 201 of the memory controller 200 by storing data in the first region 101 through the buffer program operation and storing data in the second region 102 through the main program operation. In other words, it is unnecessary to retain data for a fine program operation in the buffer memory 201. Accordingly, a size of the buffer memory 201 of the memory controller 200 may be reduced.

Figure 4:
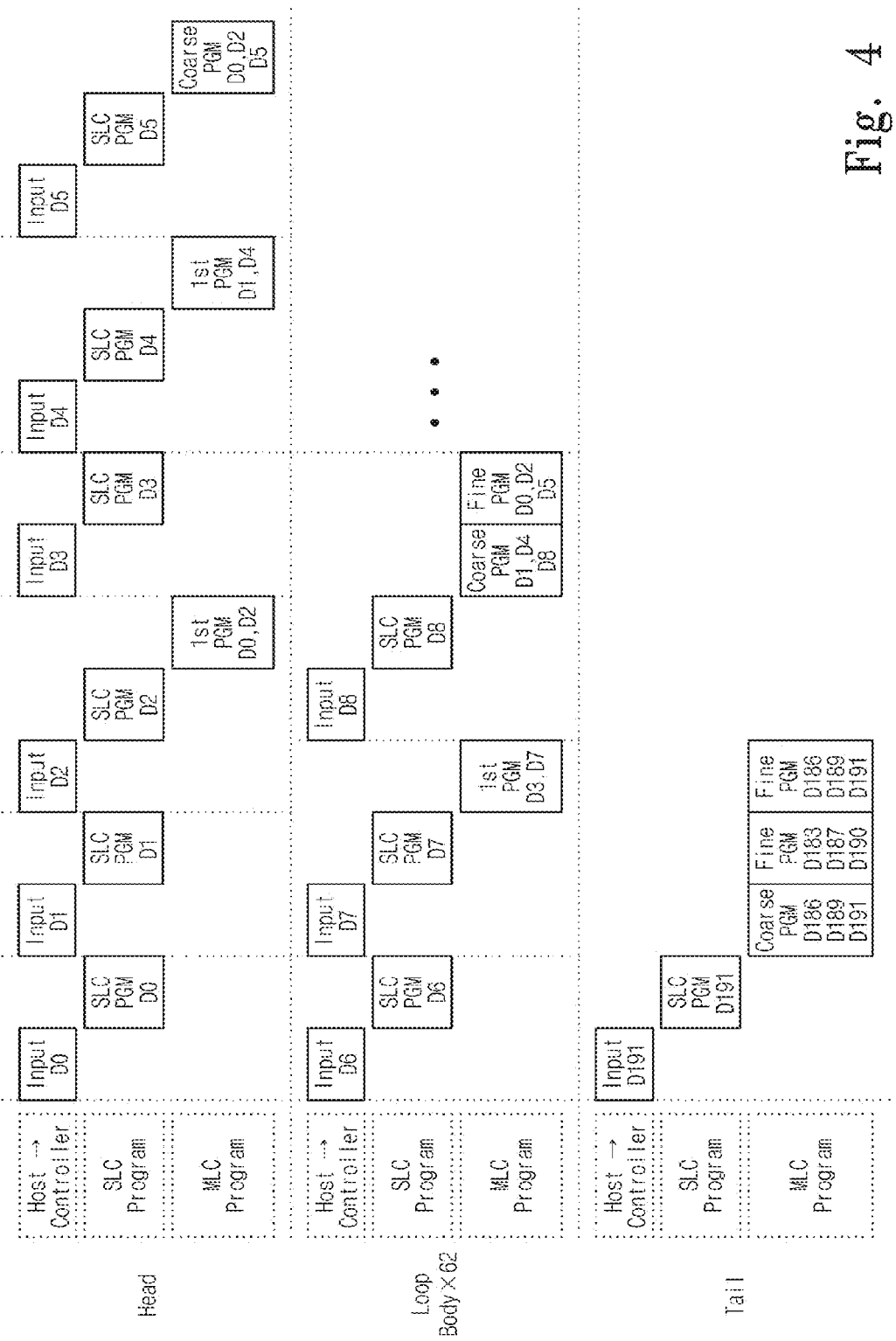
FIG. 4 is a data flow diagram for use in describing a program operation of a data storage system shown in FIG. 3.

FIG. 3 is a diagram showing an exemplary address scramble technique of a multi-bit memory device which stores 3-bit data per cell and to which a 3-step reprogram method is applied, and FIG. 4 is a diagram showing data flow at a program operation of a data storage system shown in FIG. 3. In order to simplify description, as illustrated in FIG. 3, it is assumed that each memory block includes 64 word lines WL0 to WL63 and that each memory cell stores 3-bit data. With this assumption, 192 pages may be stored in each memory block.

Referring to FIGS. 3 and 4, according to the example of this embodiment, when data D0 of the minimum program unit of the first region 101 is transferred to the buffer memory 201 of the memory controller 200 from a host 300, the data D0 stored in the buffer memory 201 is programmed (e.g., SLC programmed) in the first region 101 of a multi-bit memory device 100 under control of the memory controller 200. As described above, the data D0 may be programmed in the first region 101 through an SLC program operation. As stated previously, this is referred to herein as a buffer program operation. The memory controller 200 determines whether data of the minimum program unit of the second region 102 is gathered at the first region 101, and selectively executes a main program operation according to a determination result. The determination of whether data of the minimum program unit of the second region 102 is gathered at the first region 101 may be determined, for example, according to a page address. Since only one page D0 is stored in the first region 101, the main program operation may not be carried out. Data transferred to the first region 101 from the buffer memory 201 may include program data (also called main data) and ECC data (also called parity data). The ECC data may be generated from an ECC block 202 of the memory controller 200. A size of the ECC data may be variously determined according to an error correction protocol of a data storage system (or, a memory system).

Next, when data D1 of the minimum program unit of the first region 101 is transferred to the buffer memory 201 of the memory controller 200 from the host 300, the data D1 stored in the buffer memory 201 is programmed (e.g., SLC programmed) in the first region 101 of the multi-bit memory device 100 under control of the memory controller 200.

Next, when data D2 of the minimum program unit of the first region 101 is transferred to the buffer memory 201 of the memory controller 200 from the host 300, the data D2 stored in the buffer memory 201 is programmed (e.g., SLC programmed) in the first region 101 of the multi-bit memory device 100 under control of the memory controller 200. Since data of the minimum program unit of the second region 102 (for example, two pages of data necessary for a 1-step program operation) is gathered at the first region 101, the memory controller 200 may control the multi-bit memory device 100 such that data D0 and D2 stored in the first region 101 is stored in the second region 102. That is, the 1-step program operation on a word line WL0 may be carried out based on the data D0 and D2 stored in the first region 101.

Next, when data D3 of the minimum program unit of the first region 101 is transferred to the buffer memory 201 of the memory controller 200 from the host 300, the data D3 stored in the buffer memory 201 is programmed (e.g., SLC programmed) in the first region 101 of the multi-bit memory device 100 under control of the memory controller 200.

Next, when data D4 of the minimum program unit of the first region 101 is transferred to the buffer memory 201 of the memory controller 200 from the host 300, the data D4 stored in the buffer memory 201 is programmed (e.g., SLC programmed) in the first region 101 of the multi-bit memory device 100 under control of the memory controller 200. At this time, since data of the minimum program unit of the second region 102 (for example, two pages of data necessary for a 1-step program operation) is gathered at the first region 101, the memory controller 200 may control the multi-bit memory device 100 such that data D1 and D4 stored in the first region 101 is stored in the second region 102. That is, the 1-step program operation on a word line WL1 may be performed based on the data D1 and D4 stored in the first region 101.

As described above, if data of the minimum program unit of the first region 101 is stored in the buffer memory 201, data stored in the buffer memory 201 may be programmed in the first region 101 of the multi-bit memory device 100 under control of the memory controller 200. Data may, for example, be stored in the first region 101 through an SLC program operation. In other words, if data Di (i being 0 to 191) of the minimum program unit of the first region 101 is stored in the buffer memory 201, as shown in FIG. 4, data stored in the buffer memory 201 may be programmed in the first region 101 of the multi-bit memory device 100 through the SLC program operation under control of the memory controller 200. Together with determination of whether data of the minimum program unit for the first region 101 is stored in the buffer memory 201, the memory controller 200 may determine whether data of the minimum program unit of the second region 102 is gathered at the first region 101. The memory controller 200 may execute the 1-step program operation, the coarse program operation, or the fine program operation on the second region 102, depending upon the determination result, which will be more fully described below.

The 1-step program operation, the coarse program operation, or the fine program operation on the second region 102 may be carried out in accordance with an address scramble technique as illustrated in FIG. 3. For example, in the event that D0 and D2 data are stored in the first region 101, the 1-step program operation on a word line WL0 may be carried out depending upon the D0 and D2 data stored in the first region 101. If D1 and D4 data are stored in the first region 101, the 1-step program operation on a word line WL1 may be carried out. That is, the 1-step program operation on the word line WL1 may be carried out depending upon the D1 and D4 data stored in the first region 101.

Continuously, if D5 data is stored in the first region 101, the coarse program operation on the word line WL0 may be carried out depending upon the D0, D2, and D5 data stored in the first region 101. When D3 and D7 data are stored in the first region 101, the 1-step program operation on the word line WL2 may be carried out depending upon the D3 and D7 data stored in the first region 101. In the event that D8 data is stored in the first region 101, the coarse program operation on the word line WL1 may be carried out depending upon the D1, D4, and D8 data stored in the first region 101. After the coarse program operation on the word line WL1 is carried out depending upon the D1, D4, and D8 data stored in the first region 101, the fine program operation on the word line WL0 may be carried out depending on D0, D2, and D5 data stored in the first region 101. Afterwards, until D191 data is stored in the first region 101, the remaining data D10 to D190 may be stored in the second region 102 in the same order as the 1-step program operation of the D3 and D7 data, the coarse program operation of the D1, D4 and D8 data, and the fine program operation of the D0, D2, and D5 data.

In the case that D191 data is stored in the first region 101, the coarse program operation on the word line WL63 may be carried out depending upon D186, D189, and D191 data stored in the first region 101. After the coarse program operation on the word line WL63 is carried out depending upon D186, D189, and D191 data stored in the first region 101, the fine program operation on the word line WL62 may be made depending upon D183, D187, and D190 data stored in the first region 101. Finally, the fine program operation on the word line WL63 may be made depending upon D186, D189, and D191 data stored in the first region 101.

As understood from FIG. 4, it is possible to determine a program pattern, namely, an SLC program operation (e.g., the first program pattern), a set of SLC and 1-step program operations (e.g., the second program pattern), a set of SLC and coarse program operations (e.g., the third program pattern), a set of SLC, coarse, and fine program operations (e.g., the fourth program pattern), and a set of SLC, coarse, fine, and fine program operations (e.g., the fifth program pattern), depending upon data to be stored in the first region 101, that is, a page address of data to be stored in the first region 101. The SLC program operation, the 1-step program operation, the coarse program operation, or the fine program operation, for example, may be carried out when corresponding commands are provided to the multi-bit memory device 100 from the memory controller 200. Alternatively, a command set indicating a program pattern may be provided to the multi-bit memory device 100, and the multi-bit memory device 100 may perform a set of operations automatically according to the command set. The program pattern may be formed of an SLC program operation, a set of SLC and 1-step program operations, a set of SLC and coarse program operations, a set of SLC, coarse, and fine program operations, or a set of SLC, coarse, fine, and fine program operations. A set of program operations in a program pattern may be changed according to an address scramble technique, a cell-per-bit number, and the like.

As described above, data stored in the buffer memory 201 of the memory controller 200 may be stored in the first region 101 via a buffer program operation, and data stored in the first region 102 may be stored in the second region 102 via a main program operation. This operation may be referred to as an on-chip buffer program (OBP) operation. The main program operation may include an operation of reading data stored in the first region 101. A read error may arise during such a read operation. Below, methods of managing such a read error will be more fully described.

Figure 5:
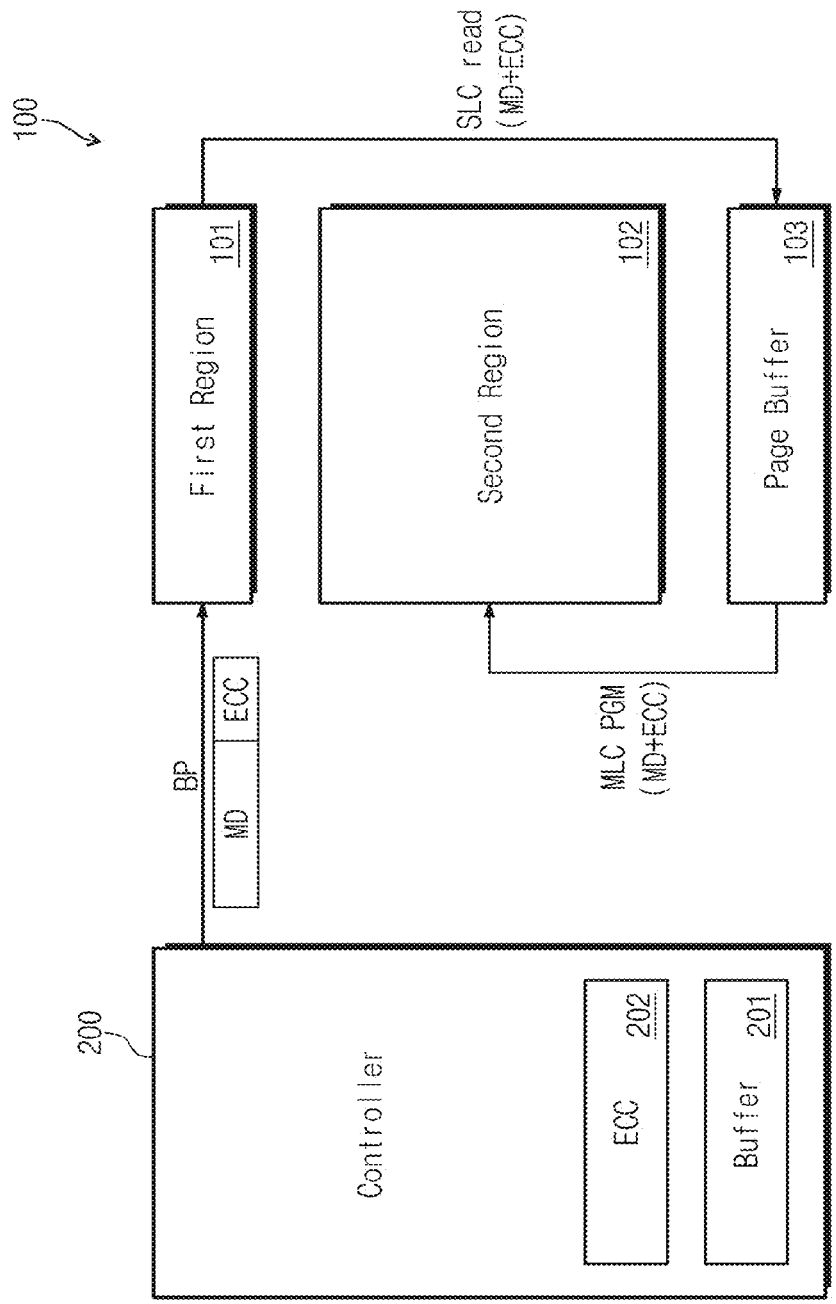
FIG. 5 is a block diagram for use in describing an on-chip buffer program sequence of a data storage system according to an exemplary embodiment of the inventive concept.

FIG. 5 is a block diagram for describing an on-chip buffer program sequence of a data storage system according to an exemplary embodiment of the inventive concepts.

According to this example, when data of the minimum program unit of the first region 101 of a multi-bit memory device 100 is provided to a buffer memory 201, data (below, referred to as program data) stored in the buffer memory 201 is sent to the multi-bit memory device 100 under the control of a memory controller 200. At this time, an ECC block 202 of the memory controller 200 may generate parity data ECC corresponding to program data (or, main data). That is, data to be stored in the first region 101 via a buffer program (BP) operation may include program data (or, main data) MD and parity data ECC. Herein, a size of the parity data ECC may be determined to have the error correction capacity corresponding to a program protocol of the second region 102 regardless of a program protocol of the first region 101. That is, a size of the parity data ECC may be determined on the basis of a read protocol of the second region 102. The multi-bit memory device 100 may store data (MD+ECC) provided from the memory controller 200 in the first region 101.

In this example, in the event that data of the minimum program unit of the second region 102 is stored in the first region 101, a set of SLC read and MCL program operations are carried out under the control of the memory controller 200. At the SLC read operation, data stored in the first region 101 may be read by a page buffer 103. At this time, the read data may include main data MD and parity data ECC. As described above, in case of 3-bit data, the SLC read operation may be performed twice until the MLC program operation as a coarse program operation is performed, and may be performed three times until the MLC program operation as a fine program operation is performed. In an exemplary embodiment, error detection and correction on data read via the SLC read operation may not be performed.

When the SLC read operation is completed, data stored in the page buffer 103 may be stored in the second region 102 via the MCL program operation (including the above-described coarse or fine program operation). At this time, the parity data ECC read from the first region 101 may be directly stored in the second region 102. That is, the parity data ECC generated on the basis of a read protocol of the second region 102 may be copied to the second region 102 from the first region 101. Herein, the error correction capacity (or, an ECC level) of the parity data ECC may be determined according to an error rate of the second region 102. Alternatively, the error correction capacity (or, an ECC level) of the parity data ECC may be determined considering an error rate of the first region 101 and an error rate of the second region 102.

As described above, detection and correction on a read error of the first region 101 storing 1-bit data in each cell may be skipped or ignored. The reason for this is because an error rate of the first region 101 is lower than that of the second region 102. This means that an error rate at a read operation on the second region 102 itself includes an error rate of the first region 101 and an error rate of the second region 102.

In an exemplary embodiment, the multi-bit memory device 100 may perform a program operation according to an ISPP (incremental step pulse programming) technique. In particular, when a program operation on the second region 102 is performed, an increment of a program voltage may be finely controlled to compensate for an error of data read from the first region 101.

Figure 6:
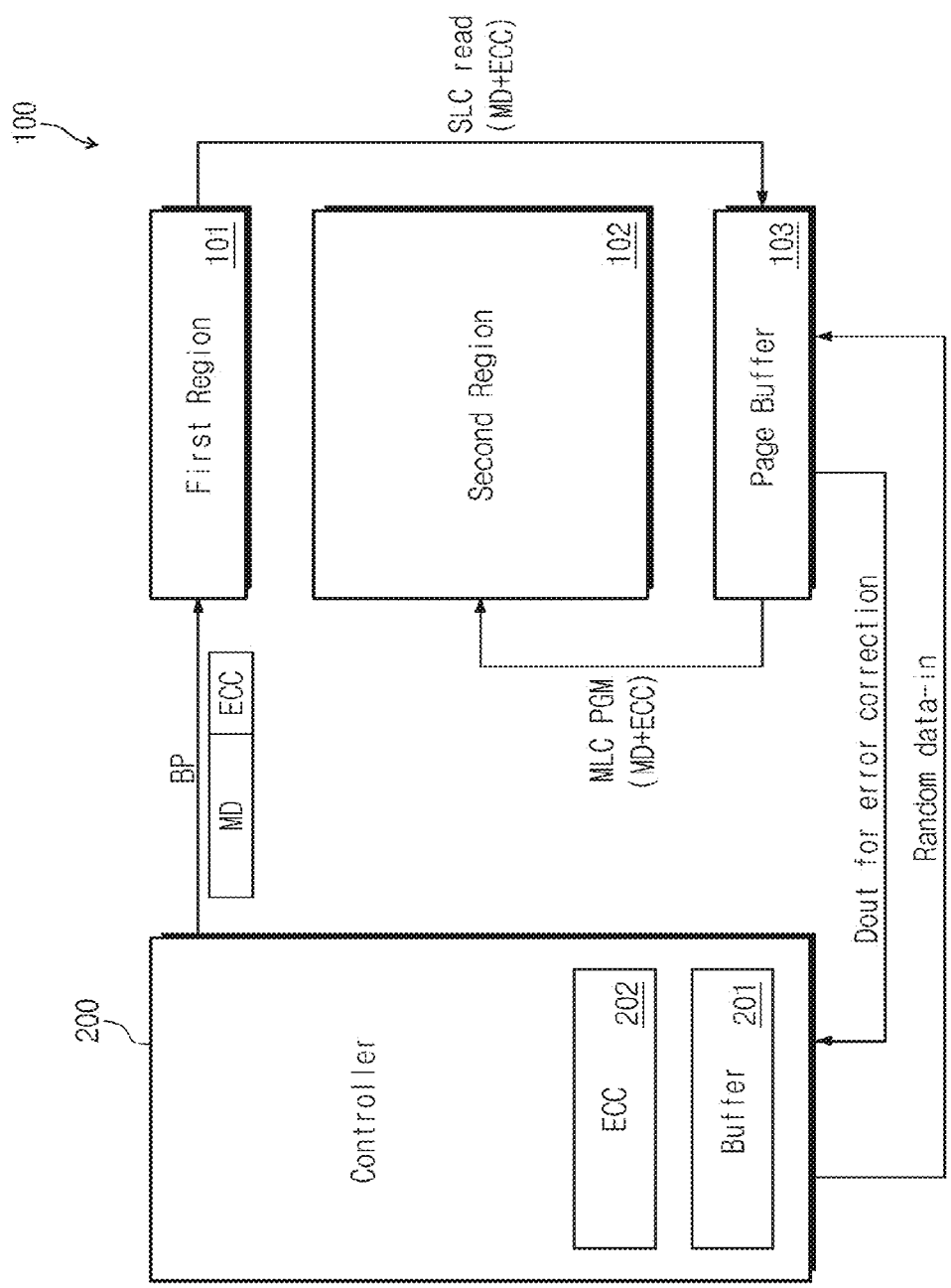
FIG. 6 is a block diagram for use in describing an on-chip buffer program sequence of a data storage system according to another exemplary embodiment of the inventive concepts.

FIG. 6 is a block diagram for describing an on-chip buffer program sequence of a data storage system according to another exemplary embodiment of the inventive concepts.

In this example, when data of the minimum program unit of the first region 101 of a multi-bit memory device 100 is provided to a buffer memory 201, data (below, referred to as program data) stored in the buffer memory 201 is sent to the multi-bit memory device 100 under the control of a memory controller 200. At this time, an ECC block 202 of the memory controller 200 may generate parity data ECC corresponding to program data (or, main data). That is, data to be stored in the first region 101 via a buffer program (BP) operation may include program data (or, main data) MD and parity data ECC. Herein, a size of the parity data ECC may be determined to have the error correction capacity corresponding to a program protocol of the second region 102 regardless of a program protocol of the first region 101. That is, a size of the parity data ECC may be determined on the basis of a read protocol of the second region 102. The multi-bit memory device 100 may store data (MD+ECC) provided from the memory controller 200 in the first region 101.

In this example, in the event that data of the minimum program unit of the second region 102 is stored in the first region 101, a set of SLC read and MCL program operations may be carried out under the control of the memory controller 200. At the SLC read operation, data stored in the first region 101 may be read by a page buffer 103. At this time, the read data may include main data MD and parity data ECC. As described above, in case of 3-bit data, the SLC read operation may be performed twice until the MLC program operation as a coarse program operation is performed, and may be performed three times until the MLC program operation as a fine program operation is performed.

After data is read from the first region 101 via the SLC read operation, error detection and correction on the read data may be carried out. For example, data stored in the page buffer may be provided to the memory controller 200. The ECC block 202 of the memory controller 200 may detect an error on the read data based upon the parity data ECC. If an error is detected, the ECC block 202 may correct the detected error. Thereafter, the corrected data may be loaded onto the page buffer 103 under the control of the memory controller 200. The above-described error detecting and correcting operations may be made whenever the SLC read operation is carried out. After the SLC read operations are completed, data stored in the page buffer 103 may be stored in the second region 102 via the MLC program operation (including the above-described coarse or fine program operation). At this time, the parity data ECC read from the first region 101 may be directly stored in the second region 102. That is, the parity data ECC generated on the basis of a read protocol of the second region 102 may be copied to the second region 102 from the first region 101. The parity data ECC can be corrected via the memory controller 200 via an error correction process before it is copied from the first region 101 to the second region 102.

Figure 7:
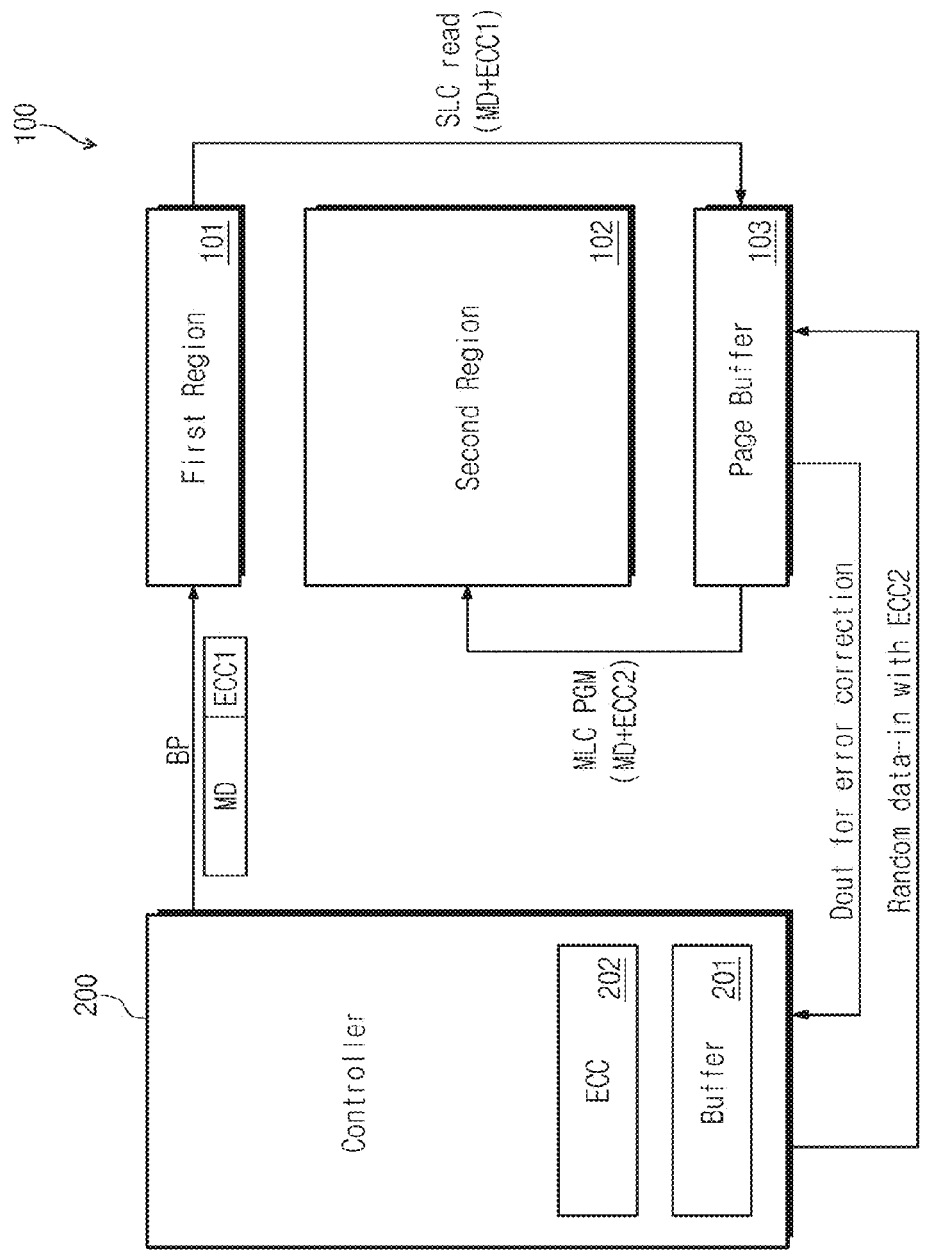
FIG. 7 is a block diagram for use in describing an on-chip buffer program sequence of a data storage system according to still another exemplary embodiment of the inventive concepts.

FIG. 7 is a block diagram for describing an on-chip buffer program sequence of a data storage system according to still another exemplary embodiment of the inventive concepts.

According to this example, when data of the minimum program unit of the first region 101 of a multi-bit memory device 100 is provided to a buffer memory 201, data (below, referred to as program data) stored in the buffer memory 201 is sent to the multi-bit memory device 100 under the control of a memory controller 200. At this time, an ECC block 202 of the memory controller 200 may generate parity data ECC1 corresponding to program data (or, main data). That is, data to be stored in the first region 101 via a buffer program (BP) operation may include program data (or, main data) MD and parity data ECC1. Herein, a size of the parity data ECC 1 may be determined to have the error correction capacity corresponding to a program protocol of the first region 101 or a read protocol of the first region 101. The multi-bit memory device 100 may store data (MD+ECC1) provided from the memory controller 200 in the first region 101.

In this example, in the event that data of the minimum program unit of the second region 102 is stored in the first region 101, a set of SLC read and MCL program operations may be carried out under the control of the memory controller 200. At the SLC read operation, data stored in the first region 101 may be read by a page buffer 103. At this time, the read data may include main data MD and parity data ECC1. As described above, in case of 3-bit data, the SLC read operation may be performed twice until the MLC program operation as a coarse program operation is performed, and may be performed three times until the MLC program operation as a fine program operation is performed.

After data is read from the first region 101 via the SLC read operation, error detection and correction on the read data may be carried out. For example, data stored in the page buffer may be provided to the memory controller 200. The ECC block 202 of the memory controller 200 may detect an error on the read data based upon the parity data ECC1. If an error is detected, the ECC block 202 may correct the detected error. Further, the ECC block 202 may generate parity data ECC2 on the basis of a read protocol of the second region 102. Herein, the error correction capacity (or, an ECC level) of the parity data ECC1 may be lower than the error correction capacity (or, an ECC level) of the parity data ECC2.

Thereafter, the corrected data and newly generated parity data ECC2 may be loaded onto the page buffer 103 under the control of the memory controller 200. The above-described error detecting and correcting operations may be made whenever the SLC read operation is carried out. After the SLC read operations are completed, data stored in the page buffer 103 may be stored in the second region 102 via the MLC program operation (including the above-described coarse or fine program operation). In this case, the newly generated parity data ECC2 may be stored in the second region 102 instead of the parity data ECC1 read from the first region 101. That is, the parity data ECC2 generated on the basis of a read manner of the second region 102 may be stored in the second region 102.

FIGS. 8A to 8D are diagrams for describing various example combinations of the first and second regions of a multi-bit memory device according to exemplary embodiments of the inventive concepts. In these figures, "BP" denotes buffer programming of the first region 101, and "MP" denotes main programming of the second region 102.

As described above, a multi-bit memory device 100 may include the first region 101 and the second region 102. Herein, the first and second regions 101 and 102 may constitute a memory cell array of the multi-bit memory device 100. Although not illustrated in figures, the memory cell array may include further regions such as a metadata region, a reserved region, and the like. It is well understood that regions of the memory cell array may be divided logically, rather than physically. This means that such regions of the memory cell array can be defined according to address mapping of a memory controller 200.

Figure 8A:
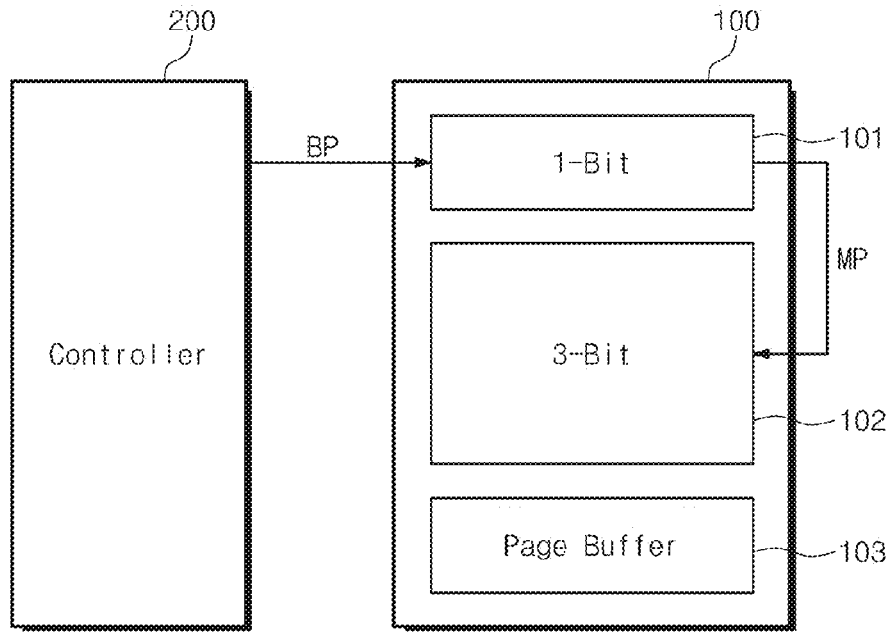
FIGS. 8A to 8D are diagrams for use in describing various combinations of first and second regions of a multi-bit memory device according to an exemplary embodiments of the inventive concepts.

Referring to FIG. 8A, in the case of a multi-bit memory device which stores 3-bit data per cell, the first region 101 may be formed of memory cells each storing 1-bit data, and the second region 102 may be formed of memory cells each storing 3-bit data. In this case, the buffer programming may be executed according to an SLC program protocol, and the main programming may be made according to the above-described MLC program protocol.

Figure 8B:
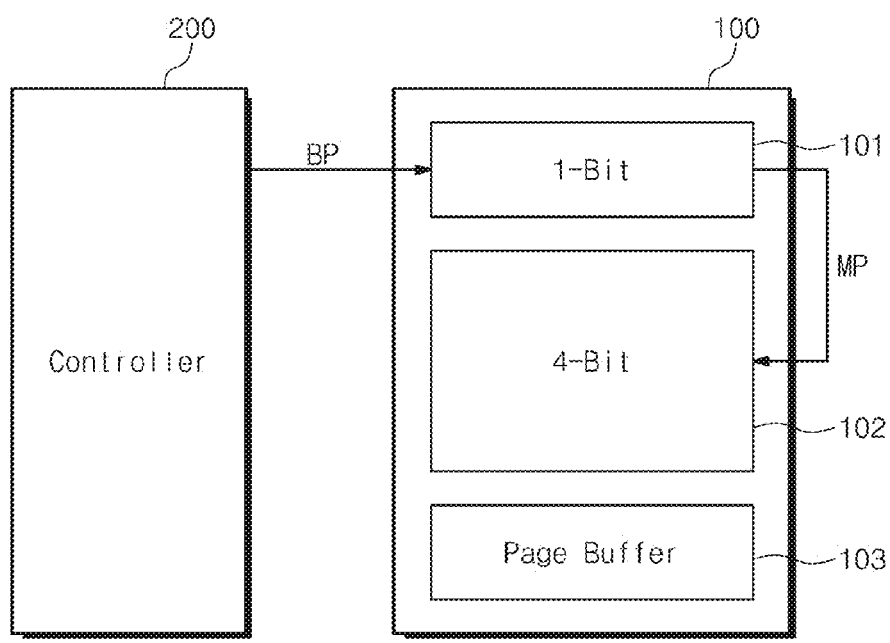

Referring to FIG. 8B, in the case of a multi-bit memory device which stores 4-bit data per cell, the first region 101 may be formed of memory cells each storing 1-bit data, and the second region 102 may be formed of memory cells each storing 4-bit data. In this case, the buffer programming may be executed according to an SLC program protocol, and the main programming may be made according to the above-described MLC program protocol.

Figure 8C:
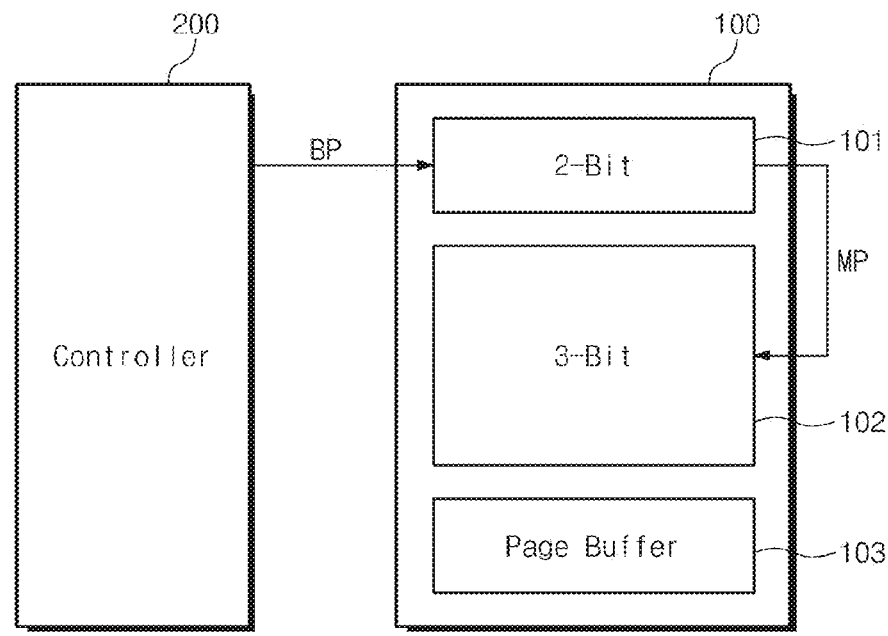

Referring to FIG. 8C, in the case of a multi-bit memory device which stores 3-bit data per cell, the first region 101 may be formed of memory cells each storing 2-bit data, and the second region 102 may be formed of memory cells each storing 3-bit data. In this case, the buffer programming may be executed according to the above-described or conventional MLC program protocol, and the main programming may be made according to the above-described MLC program protocol (for example, a reprogram protocol).

Figure 8D:
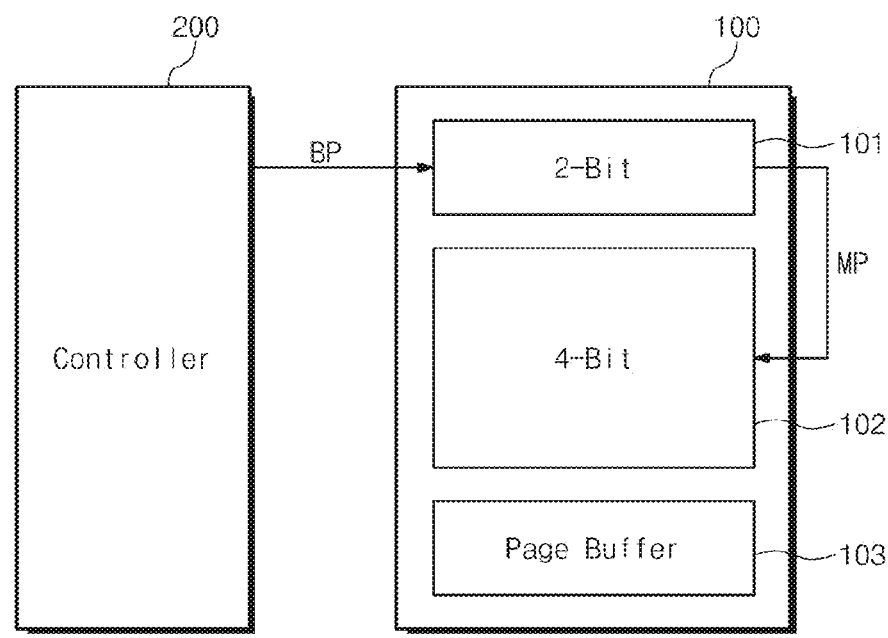

Referring to FIG. 8D, in the case of a multi-bit memory device which stores 4-bit data per cell, the first region 101 may be formed of memory cells each storing 2-bit data, and the second region 102 may be formed of memory cells each storing 4-bit data. In this case, the buffer programming may be executed according to the above-described or conventional MLC program protocol, and the main programming may be made according to the above-described MLC program manner (for example, a reprogram protocol).

As demonstrated by the examples of FIGS. 8B-8D, the first memory region 101 may be a multi-level memory cell (MLC) region in which N bits (N is an integer of 2 or more) of data are stored in each memory cell, where N<M.

Defining of the first and second regions 101 and 102 illustrated in FIGS. 8A to 8D is not limited by this disclosure. For example, if a storage medium included in a data storage device is formed of a plurality of multi-bit memory devices, the first and second regions 101 and 102 can be defined with respect to the respective multi-bit memory devices. Alternatively, the first region 101 can be defined with respect to any one of the multi-bit memory devices. Alternatively, any one multi-bit memory device can be defined as the first region 101.

In an exemplary embodiment of the inventive concepts, memory cells are formed of variable resistance memory cells. An exemplary variable resistance memory cell and a memory device including the same are disclosed in U.S. Pat. No. 7,529,124, the entirety of which is incorporated by reference herein.

In another exemplary embodiment of the inventive concepts, memory cells may be formed of one of various cell structures having a charge storage layer. Cell structures having a charge storage layer may include a charge trap flash structure using a charge trap layer, a stack flash structure in which arrays are stacked in a multiple layer, a source-drain free flash structure, a pin-type flash structure, and so on.

Memory devices having a charge trap flash structure as a charge storage layer are disclosed in U.S. Pat. No. 6,858,906 and U.S. Patent Publication Nos. 2004/0169238 and 2006/0180851, the entireties of which are incorporated by reference herein. A source-drain free flash structure is disclosed in KR Patent No. 673020, the entirety of which is incorporated by reference herein.

A flash memory device and/or a memory controller according to the inventive concepts may be packaged using various types of package technologies. For example, a non-volatile memory device or a memory controller according to the inventive concept may be packaged using package technologies such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A data storage device comprising:
a multi-bit memory device including a memory cell array, the memory cell array including a first memory region and a second memory region; and
a memory controller including a buffer memory and configured to control the multi-bit memory device,
wherein the memory controller is configured to control the multi-bit memory device to execute a buffer program operation in which data stored in the buffer memory is stored in the first memory region,
wherein the memory controller is further configured to control the multi-bit memory device to execute a main program operation in which the data stored in the first memory region is stored in the second memory region, and wherein the memory controller is further configured to generate parity data based upon the data stored to the first memory region, and to store the parity data in the first memory region, the parity data being copied from the first memory region to the second memory region via the main program operation.

2. The data storage device of claim 1, wherein the first memory region is formed of memory cells each storing 1-bit data, and the second memory region is formed of memory cells each storing M-bit data, where M is an integer of 3 or more.

3. The data storage device of claim 2, wherein a size of the parity data is determined on the basis of a read protocol of the second memory region.

4. The data storage device of claim 3, wherein the memory controller is configured to execute the buffer program operation when data corresponding to a minimum program unit of the first memory region is stored in the buffer memory, and to executed the main program operation when data corresponding to a minimum program unit of the second memory region is stored in the first memory region.

5. A data storage device comprising:
a multi-bit memory device including a memory cell array, the memory cell array including a first memory region and a second memory region; and
a memory controller including a buffer memory and configured to control the multi-bit memory device,
wherein the memory controller is configured to control the multi-bit memory device to execute a buffer program operation in which data stored in the buffer memory is stored in the first memory region,
wherein the memory controller is further configured to control the multi-bit memory device to execute a main program operation in which the data stored in the first memory region is stored in the second memory region,
wherein the memory controller is further configured to generate parity data based upon the data stored to the first memory region, and to store the parity data in the first memory region, the parity data being copied from the first memory region to the second memory region via the main program operation, and
wherein the main program operation includes a course program operation, a fine program operation, a single-bit read operation of reading data from the first memory region and a multi-bit program operation of storing data read from the first memory region in the second memory region, the single-bit read operation being repeated according to the main program operation.

6. The data storage device of claim 5, wherein the main program operation further includes a data output operation in which data read via the single-bit read operation is sent to the memory controller for error detection and correction.

7. An on-chip buffer program method of a data storage device which includes a multi-bit memory device having a memory cell array, and a memory controller having a buffer memory and configured to control the multi-bit memory device, the on-chip buffer program method comprising:
executing a buffer program operation when data corresponding to a minimum program unit of a first region of the memory cell array is stored in the buffer memory; and
executing a main program operation when data corresponding to a minimum program unit of a second region of the memory cell array is stored in the first region,
wherein the buffer program operation includes generating parity data based upon data transferred to the first region and storing the parity data in the first region, and the main program operation includes copying the parity data from the first region to the second region.

8. The on-chip buffer program operation of claim 7, wherein the first region is formed of memory cells each storing 1-bit data and the second region is formed of memory cells each storing M-bit data, M being an integer of 3 or more.

9. The on-chip buffer program operation of claim 7, wherein a size of the parity data is determined on the basis of a read protocol of the second region.

10. The on-chip buffer program operation of claim 9, wherein the main program operation includes at least one of a 1-step program operation, a coarse program operation, and a fine program operation.

11. The on-chip buffer program operation of claim 10, wherein the main program operation includes a single-bit read operation of reading data from the first region and a multi-bit program operation of storing data read from the first region in the second region, the single-bit read operation being repeated according to the main program operation.

12. The on-chip buffer program operation of claim 11, wherein the main program operation includes a data output operation in which data read via the single-bit read operation is sent to the memory controller for error detection and correction.

* * * * *